July 30, 1957 F. H. BLECHER 2,801,296

D-C SUMMING AMPLIFIER DRIFT CORRECTION

Filed Feb. 9, 1954 3 Sheets-Sheet 1

INVENTOR
F. H. BLECHER
BY R. B. Ardis
ATTORNEY

INVENTOR
F. H. BLECHER
BY R. B. Ardis
ATTORNEY.

INVENTOR
F. H. BLECHER
BY R. B. Ardis
ATTORNEY

United States Patent Office 2,801,296

Patented July 30, 1957

2,801,296

D.-C. SUMMING AMPLIFIER DRIFT CORRECTION

Franklin H. Blecher, Brooklyn, N. Y., assignor to Bell Telephone Laboratories, Incorporated, New York, N. Y., a corporation of New York Application February 9, 1954, Serial No. 409,042

3 Claims. (Cl. 179—171)

This invention relates generally to D.-C. summing amplifiers and more particularly, although not exclusively, to D.-C. summing amplifiers which employ transistors to produce the desired gain.

In general, D.-C. drift has always been a problem in the design and operation of high gain direct-coupled amplifiers. Both the characteristics of the active devices relied upon to provide amplification and the voltages produced by D.-C. supply sources tend to change somewhat with time and temperature, producing slow drifts in the outputs of the gain-producing devices. Since such amplifiers are operative at zero frequency, drift voltages are amplified along with the applied signals and appear in the final outputs superimposed upon the amplified signals. Because of the high gain between their input summing points and their output terminals, D.-C. summing amplifiers of the feedback type are particularly subject to this difficulty.

In vacuum tube summing amplifiers (such as, for example, the one disclosed in United States Patent 2,401,779, issued June 11, 1946, to K. D. Swartzel, Jr.), one of the most satisfactory arrangements for the correction of D.-C. drift involves the use of a pair of tubes, usually within a single envelope, connected substantially in parallel as the first stage of the amplifier. The control grid of one is used as the input summing point, and that of the other provides a place for the application of the drift correction. The cathodes of the two tubes are usually connected together. Since the gain of the summing amplifier between the input summing point and the amplifier output terminals is very high, the input signals at the grid of the first tube are made so small by negative feedback as to be negligible with respect to any D.-C. drift. The signal voltages, for example, are commonly of the order of several microvolts, but the drift might be several millivolts. Since the control grid cathode path of the vacuum tube presents substantially an open circuit, no grid current is drawn, and the D.-C. voltage at the first grid is an accurate measure of the amount of drift. This voltage is amplified by an essentially drift free narrow band amplifier and is applied to the grid of the second of the pair of tubes.

The accuracy of this prior art arrangement for drift correction is dependent upon the fact that the first stage of the summing amplifier draws no grid current. If it did, the direct voltage appearing at the control grid of the first stage would be representative of that as well as of the amount of D.-C. drift. Such a circuit would operate only to maintain substantially zero D.-C. potential at the grid of the first tube and would give no drift correction.

As might be expected, transistor summing amplifiers are subject to many of the same problems of D.-C. drift as vacuum tube summing amplifiers. The above-described technique for drift correction in vacuum tube summing amplifiers is not, however, applicable to transistor summing amplifiers.

In order to secure the desired high gain between the input summing point and the amplifier output terminals, as well as the over-all phase reversal needed for negative feedback, the individual stages of a transistor summing amplifier are often of the so-called common-emitter configuration. One such transistor summing amplifier is disclosed, for example, in application Serial No. 311,770, filed September 26, 1952, by S. Darlington and J. H. Felker. The above-described arrangement for eliminating drift in vacuum tube summing amplifiers is not applicable to such transistor circuits for the reason that the transistors draw a substantial amount of base current. If it were attempted to use such an arrangement, it would operate only to maintain zero D.-C. potential at the base electrode of the first transistor. Since the D.-C. potential there is actually representative of the amount of base current flowing in the transistor as well as the amount of D.-C. drift, no accurate drift correction would be obtained.

It is, therefore, a principal object of the present invention to provide an arrangement for the correction of D.-C. drift in a summing amplifier that is not dependent upon the failure of the input electrode of the first stage of the amplifier to draw current.

A related object is to provide accurate compensation for D.-C. drift in a transistor summing amplifier.

Another object is to compensate for drift in a transistor summing amplifier without introducing any unwanted noise into the amplifier output in the course of the compensation.

In accordance with the invention, D.-C. drift is eliminated from the output of the direct-coupled transistor summing amplifier of the feedback type by applying both the input signals of the amplifier and the voltage appearing at the output of the amplifier to an auxiliary summing point, where everything cancels out but a voltage proportional to and of the same polarity as any drift component appearing in the amplifier output voltage, and applying this voltage representative of D.-C. drift to the summing amplifier as an additional input. The summing amplifier imparts a net phase reversal to each signal passing through it, with the result that the voltages applied to the auxiliary summing point contain components in phase opposition for each signal. Such components cancel each other and leave a voltage substantially proportional to the D.-C. drift of the summing amplier, which is represented only at the summing amplifier output by a drift component appearing in the amplifier output voltage. Amplified and applied to the input of the summing amplifier, this voltage passes through the summing amplifier and cancels the D.-C. drift component of the summing amplifier ouput voltage.

One important feature of many embodiments of the invention is an arrangement by which D.-C. drift appearing in the output of a transistor summing amplifier is compensated without introducing any unwanted noise into the amplified output in the course of the compensation. In a principal embodiment of the invention, D.-C. drift voltage developed at the auxiliary summing point is applied to the summing amplifier input through a tuned A.-C. amplifier and a low pass filter. A synchronous chopper, operating at the frequency to which the A.-C. amplifier is tuned, converts the drift signal to A.-C. for amplification and reconverts the amplified drift signal to D.-C. for application to the summing amplifier input. The narrow band of the A.-C. amplifier prevents amplifier noise from attaching itself to the drift signal in the course of its amplification, and the low pass filter removes substantially all of the A.-C. components from the amplified drift signal before it is applied to the summing amplifier.

A more complete understanding of the invention may be obtained from a study of the following detailed description of one generalized and one specific embodiment. In the drawings.

Figure 1:
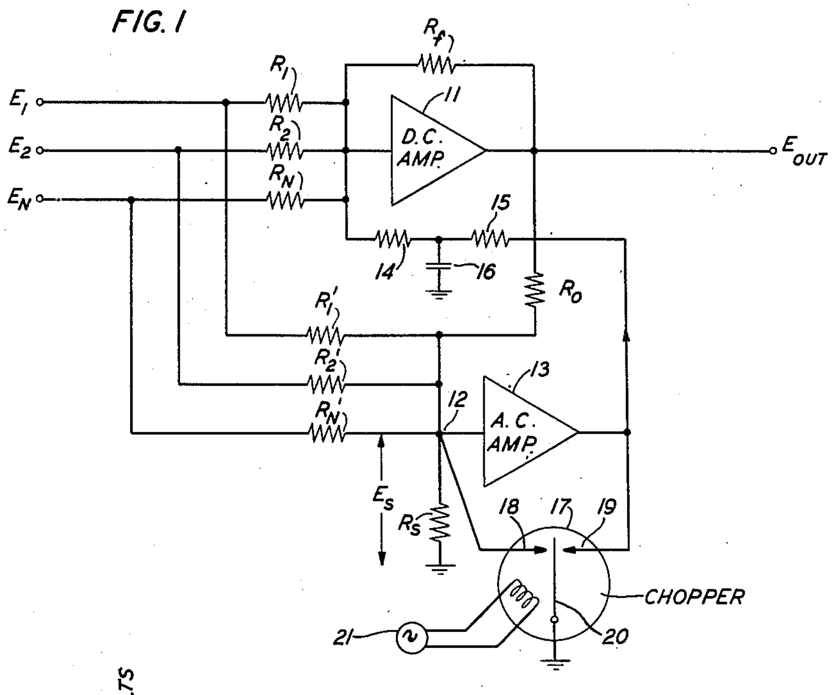
Fig. 1 is a block diagram of an embodiment of the invention.

The embodiment of the invention illustrated in Fig. 1 includes a direct coupled summing amplifier of the feedback type and a circuit arrangement for correcting for any D.-C. dift that may appear in the summing amplifier. The summing amplifier itself includes a high gain direct coupled amplifier 11 having a 180-degree phase reversal between its input and output terminals. A feedback resistor $R_f$ is connected directly between the input and output terminals of amplifier 11, and one or more signal input leads are connected to the input terminal through separate series summing resistors $R_1$, $R_2$ . . . $R_N$. Because of the large amount feedback through $R_f$, the voltages $E_1$, $E_2$ . . . $E_N$ applied to the respective input leads are represented in the voltage appearing in the output terminal of amplifier 11 by respective components proportional to each input signal, the proportionality factor being the ratio of the feedback resistance $R_f$ to the individual series input resistance in each input lead. In addition, however, an unwanted D.-C. drift voltage may also be included in the output terminal. Mathematically, this situation may be represented by the equation $$E_{\text{out}}=-\sum_{n=1}^{N}E_n\frac{R_f}{R_n}+E_{\text{drift}} \qquad (1)$$

where $E_n$ is the input signal voltage at each input lead and $R_n$ is the series resistance in each input lead.

The present invention makes possible the elimination of the drift component of the output voltage even though current may be drawn by the input electrode of the first stage of amplifier 11. As illustrated in Fig. 1, the respective input voltages $E_1$, $E_2$, . . . $E_N$ are applied through individual series summing resistors $R_1'$, $R_2'$, . . . $R_N'$ to an auxiliary summing point 12. A tuned A.-C. amplifier 13 is connected in series with a low-pass filter composed of a pair of series resistors 14 and 15 and a shunt capacitor 16 between summing point 12 and the input terminal of direct coupled amplifier 11. An input resistor $R_s$ is connected between auxiliary summing point 12 and ground across the input of A.-C. amplifier 13 and is the element across which the auxiliary summing point voltage $E_s$ is developed. If the input signal voltages contain frequency components outside the frequency range for which Equation 1 is accurate, then a low pass filter may be introduced between $R_s$ and the input of A.-C. amplifier 13 in order to eliminate their effects. A synchronous chopper 17, having a pair of contacts 18 and 19 and an armature 20, is energized by an A.-C. supply source 21 and is connected to convert the voltage $E_s$ to A.-C. and to reconvert the output voltage of A.-C. amplifier 13 to D.-C. Contact 18 is connected to the input terminal and contact 19 is connected to the output terminal of A.-C. amplifier 13. When chopper 17 is energized by source 21 at the frequency to which A.-C. amplifier is tuned, armature 20 alternately engages contacts 18 and 19. The voltage $E_s$ is thereby converted to a complex wave, the fundamental component of which is a sine wave having a frequency equal to the tuned frequency of amplifier 13 and an amplitude proportional to the amplitude of the voltage $E_s$. The voltage at the output of amplifier 13 is, at the same time, reconverted to D.-C. and most of the A.-C. components which remain superimposed thereon are removed by the low pass filter composed of resistors 14 and 15 and capacitor 16. Amplifier 13 is arranged to give a net phase reversal between auxiliary summing point 12 and its output terminal, but the action of chopper 17 restores the polarity of the output voltage to that of $E_s$. Finally, a resistor $R_0$ is connected between the output terminal of D.-C. amplifier 11 and auxiliary summing point 12.

As shown by Equation 1, the output voltage of the summing amplifier is equal to the negative of the weighted sum of the input voltages plus a drift voltage. In order to isolate this drift voltage, the resistance summing network composed of resistors $R_0$, $R_1'$, $R_2'$ . . . $R_N'$ is used to sum the $n$ input voltages and the output voltage of the D.-C. summing amplifier. Mathematically, the voltage at auxiliary summing point 12, the output of this resistance summing network, is represented by the equation $$E_s=\frac{R_s}{R_0}\left[\sum_{n=1}^{N}E_n\frac{R_0}{R_n'}+E_{\text{out}}\right] \qquad (2)$$

if $$R_s<<R_0,\ R_n';\ n=1,\ 2\ .\ .\ .\ N \qquad (3)$$

Substitution of the value for $E_{out}$ given in Equation 1 into Equation 2 gives $$E_s=\frac{R_s}{R_0}\left[\sum_{n=1}^{N}E_n\frac{R_0}{R_n'}-\sum_{n=1}^{N}E_n\frac{R_f}{R_n}+E_{\text{drift}}\right] \qquad (4)$$

If $$R_0R_n=R_fR_n';\ n=1,\ 2\ .\ .\ .\ N \qquad (5)$$

the various signal voltage components in $E_s$ cancel each other out, leaving only a direct voltage component proportional to the drift component of the summing amplifier output voltage. Thus, $$E_s=\frac{R_s}{R_0}E_{\text{drift}} \qquad (6)$$

In the embodiment of the invention illustrated in Fig. 1, the voltage $E_s$ is converted to A.-C. by the synchronous chopper 17 and is amplified by the tuned A.-C. amplifier 13. Since amplifier 13 is tuned, it introduces substantially no noise. The output voltage of amplifier 13 is converted back to D.-C. by chopper 17. Since the tuned amplifier 13 produces one net phase reversal, the chopper 17 preserves the polarity of the D.-C. drift signal. This amplified voltage is then filtered and applied as an additional input to the summing amplifier which is of the same polarity as the drift component in the summing amplifier output voltage. The amplified drift signal from A.-C. amplifier 13 is amplified by the direct coupled amplifier 11, and since it undergoes the same phase reversal as the signal voltages $E_1$, $E_2$, . . . $E_N$ cancels the drift component in the summing amplifier output voltage. The amplification obtained from A.-C. amplifier 13 is chosen to give the desired amount of drift reduction at the output of the direct coupled amplifier 11.

Figure 2:
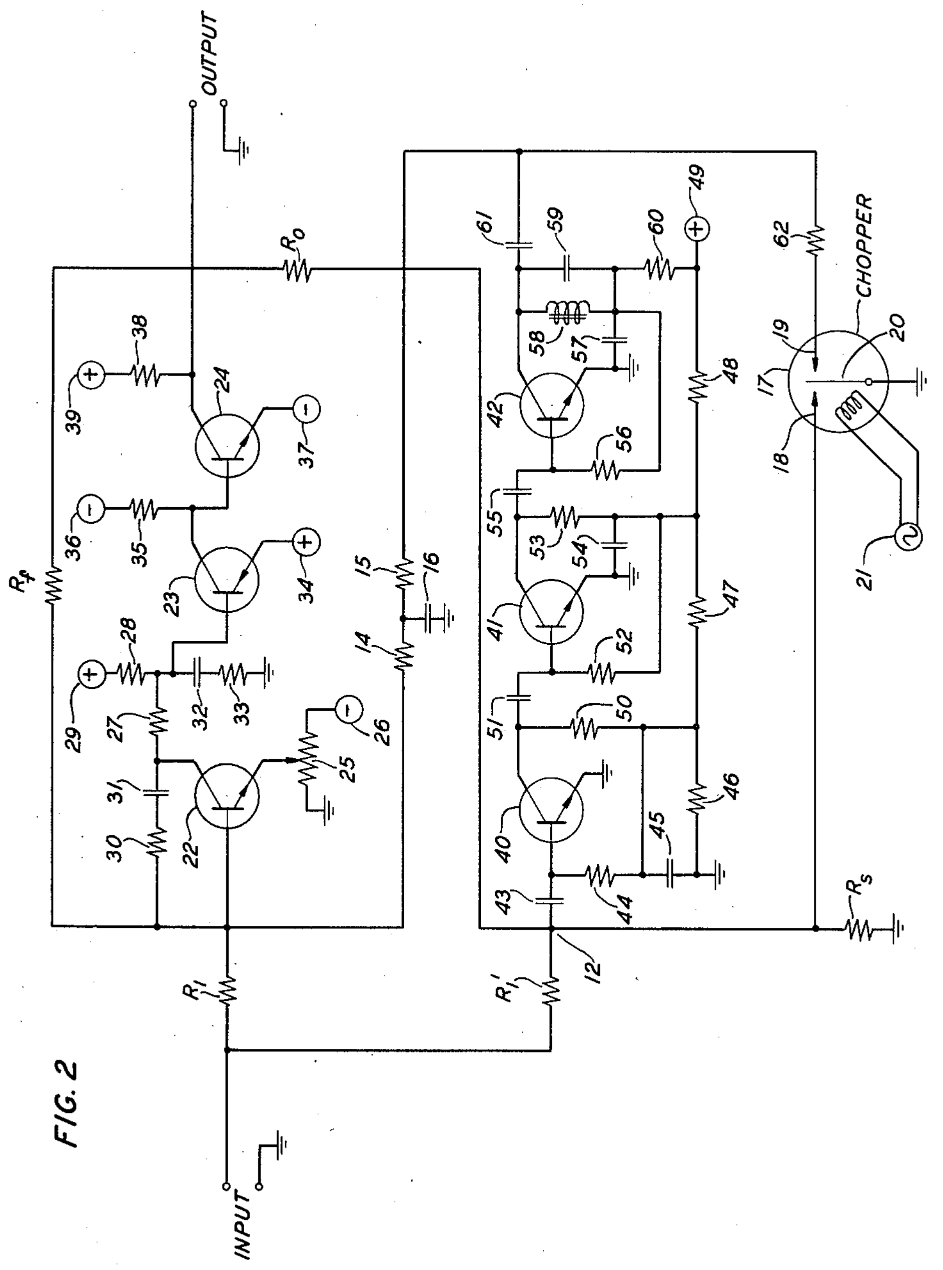
Fig. 2 is a schematic diagram of a specific embodiment of the invention adapted to correct for drift in a direct coupled transistor summing amplifier.

Fig. 2 shows complete circuit details of an embodiment of the invention in which D.-C. drift compensation is applied to a three-stage transistor summing amplifier of the feedback type. Fig. 2 shows provision for only one input signal voltage, but it is to be understood that others may be added in the same manner as in Fig. 1. In general, however, Fig. 2 may be considered a more detailed diagram of the embodiment of the invention shown in block diagram form in Fig. 1.

The direct coupled summing amplifier in Fig. 2 is composed of three transistors 22, 23, and 24, each of which forms a stage of the so-called common emitter (sometimes referred to as grounded emitter) configuration. In order to make the interstage coupling as simple as possible and with as little loss of gain as possible, the second transistor 23 is of opposite conductivity type from the first and third transistors 22 and 24. For convenience, the conventional transistor symbols shown indicate positive emitter current flow away from the base in the case of transistors 22 and 24 and toward the base in the case of transistor 23. Each transistor may be replaced with a similar transistor of the opposite conductivity type without affecting the nature of operation of the circuit if the polarities of the respective D.-C. supply sources are also reversed.

The base electrode of the first transistor 22 forms the input electrode of the three-stage D.-C. amplifier in Fig. 2. The emitter electrode of transistor 22 is connected to the movable arm of a manual zero set potentiometer 25. One end of the resistance arm of potentiometer 25 is grounded, and the other is connected to a direct negative potential 26. The collector electrode of transistor 22 is connected through a small resistor 27 and a relatively large resistor 28 to a direct positive potential 29. Local negative feedback around transistor 22 is provided by resistor 27 and the series combination of a resistor 30 and a capacitor 31 connected between the transistor base and collector electrodes.

In order to stabilize the over-all negative feedback of the direct coupled amplifier formed by transistors 22, 23, and 24, a capacitor 32 and a resistor 33 are connected in series between the base electrode of the second transistor 23 and ground. In order to receive signals from the first stage, the base of transistor 23 is connected to the junction between resistors 27 and 28. At the output side of transistor 23, operating potentials are supplied by a connection between the emitter electrode and a direct positive potential 34 and a connection into a resistor 35 from the collector electrode and a direct negative potential 36.

In the final stage of the summing amplifier, the base electrode of transistor 24 is connected directly to the collector electrode of transistor 23 in the preceding stage. The emitter electrode of transistor 24 is connected to a direct negative potential 37, while the collector is connected through a resistor 38 to a direct positive potential 39. The collector electrode of transistor 24 also forms the output terminal of the summing amplifier.

Since each common emitter stage provides a phase reversal between its base and collector electrodes, the entire three-stage amplified formed by transistors 22, 23, and 24 provides one net phase reversal. This makes possible the over-all negative feedback provided by resistor $R_f$, which is connected between the collector electrode of transistor 24 in the third stage and the base electrode of transistor 22 in the first.

The tuned A.-C. amplifier in Fig. 2 is composed of three transistors 40, 41, and 42 each connected in a stage of the so-called common emitter configuration. Auxiliary summing point 12 is connected to the base electrode of the first transistor 40 through a coupling condenser 43, and that base electrode is also connected to ground through the series combination of a biasing resistor 44 and a condenser 45. A direct voltage supply for this and the other transistors of the A.-C. amplifier is formed by three resistors 46, 47, and 48 connected in series between ground and a direct positive potential 49. A connection from the junction between resistor 44 and condenser 45 to that between resistors 46 and 47 permits condenser 45 to serve as a bypass element for resistor 46. A resistor 50 connected between the collector electrode of transistor 40 and the junction between resistors 46 and 47 supplies a suitable collector bias to the transistor. The emitter electrode of transistor 40 is grounded.

The second A.-C. amplifier stage is similar to the first. Output is taken from the collector of transistor 40 and applied through a coupling condenser 51 to the base electrode of the second transistor 41. A biasing resistor 52 is connected from the base of transistor 41 to the junction between resistors 47 and 48, while potential is supplied to the collector of transistor 41 by a resistor 53 connected from that same junction point to the collecor electrode. A bypass condenser 54 is connected to ground from the junction point between resistors 47 and 48. The emitter of transistor 41 is connected directly to ground.

The third or output stage of the A.-C. amplifier in Fig. 2 differs somewhat from the first two. Like the first two stages, it is of the common emitter configuraion. It differs, however, in that it has a tuned output circuit. By way of example, the tuned frequency of the output stage may be 60 cycles.

Output is supplied from the collector electrode of transistor 41 to the base electrode of transistor 42 through a coupling condenser 55. A series path to ground from the base of transistor 42 exists through a biasing resistor 56 and condenser 57. The emitter electrode of transistor 42 is grounded, and an inductance coil 58 shunted by a capacitor 59 is connected between the collector of transistor 42 and the junction between resistor 56 and condenser 57. A resistor 60 is connected between the ungrounded side of condenser 57, which serves as a bypass element, and the direct positive potential 49 to supply an operating potential to the collector of transisor 42.

A coupling condenser 61 is connected between the collector electrode of transistor 42 and the filter composed of resistors 14 and 15 and capacitor 16. Resistors 14 and 15 are connected in series between condenser 61 and the base electrode of the first transistor 22 of the direct coupled summing amplifier, while capacitor 16 is returned to ground from the mid-point between resistors 14 and 15. The input and output voltages of the D.-C. summing amplifier are applied to the input of the A.-C. amplifier in the same manner as in Fig. 1, i. e., by a resistor $R_1'$ connected between input summing resistor $R_1$ and the auxiliary summing point 12 and by a resistor $R_0$ connected between the collector electrode of the third transistor 24 of the summing amplifier and auxiliary summing point 12. A resistor $R_s$ is returned to ground from summing point 12, and chopper 17 is connected in the same manner as in Fig. 1 between auxiliary summing point 12 and the output side of the A.-C. amplifier. Chopper 17 is supplied with power from an A.-C. source 21 having a frequency equal to the tuned frequency of the A.-C. amplifier and a resistor 62 is connected between chopper contact 19 and the output side of the A.-C. amplifier to protect the contact from excessive current.

The following may be taken as typical for the circuit elements of the embodiment of the invention illustrated in Fig. 2:

| | |
|---|---|
| Resistor $R_1$ | 250,000 ohms. |
| Resistor $R_1'$ | 1 megohm. |
| Resistor $R_0$ | 1 megohm. |
| Resistor $R_f$ | 250,000 ohms. |
| Resistor $R_s$ | 8000 ohms. |
| Resistor 14 | 50,000 ohms. |
| Resistor 15 | 150,000 ohms. |
| Condenser 16 | 40 microfarads. |
| Chopper 17 | Leeds and Northrup 60 cycle vibrator Model #Std. 3338–1. |
| A.-C. source 21 | 20 volts 60 cycles. |
| Transistor 22 | 1853 type (n-p-n). |
| Transistor 23 | 1778 type (p-n-p). |
| Transistor 24 | 1858 type (n-p-n). |
| Potentiometer 25 | 100 ohms. |
| Direct voltage 26 | —1.5 volts. |
| Resistor 27 | 200 ohms. |
| Resistor 28 | 36,000 ohms. |
| Direct voltage 29 | +33 volts. |
| Resistor 30 | 5600 ohms. |
| Condenser 31 | 0.1 microfarad. |
| Condenser 32 | 8 microfarads. |
| Resistor 33 | 0.5 ohm. |
| Direct voltage 34 | +1.5 volts. |
| Resistor 35 | 22,000 ohms. |
| Direct voltage 36 | —45 volts. |
| Direct voltage 37 | —27 volts. |
| Resistor 38 | 18,000 ohms. |
| Direct voltage 39 | +33 volts. |
| Transistor 40 | 1858 type (n-p-n). |
| Transistor 41 | 1858 type (n-p-n). |

| | |
|---|---|
| Transistor 42 | 1858 type (n-p-n). |
| Condenser 43 | 4 microfarads. |
| Resistor 44 | 3 megohms. |
| Condenser 45 | 25 microfarads. |
| Resistor 46 | 600 ohms. |
| Resistor 47 | 900 ohms. |
| Resistor 48 | 1600 ohms. |
| Direct voltage 49 | +33 volts. |
| Resistor 50 | 5100 ohms. |
| Condenser 51 | 4 microfarads. |
| Resistor 52 | 460,000 ohms. |
| Resistor 53 | 10,000 ohms. |
| Condenser 54 | 25 microfarads. |
| Condenser 55 | 4 microfarads. |
| Resistor 56 | 560,000 ohms. |
| Condenser 57 | 25 microfarads. |
| Coil 58 | 8 henries. |
| Condenser 59 | 1 microfarad. |
| Resistor 60 | 22,000 ohms. |
| Condenser 61 | 0.5 microfarad. |
| Resistor 62 | 3000 ohms. |

The curves of Figs. 3A through 3E illustrate the operation of the combination of chopper 17 and the A.-C. amplifier in Fig. 2 in supplying a compensating signal for the elimination of D.-C. drift in the summing amplifier. The polarity of any D.-C. drift component appearing in the output voltage of the summing amplifier may, of course, be either positive or negative. Figs. 3A through 3E are shown, therefore, in two parts, the left-hand portion of each figure representing the waveform at a particular point in the circuit for a positive drift voltage and the right-hand portion representing the waveform for a negative drift voltage.

Figure 3A:
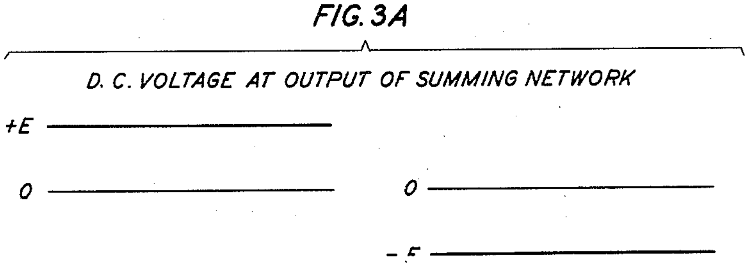
Figs. 3A through 3E are wave forms illustrating the operation of the combination of the chopper and the A.-C. amplifier in the circuit of Fig. 2.

Fig. 3A shows the waveforms appearing at auxiliary summing point 12 for both positive and negative drift voltages of an assumed magnitude E. As has already been explained, corresponding signal components at that point are of opposite polarity and cancel each other, leaving only a voltage representative of the summing amplifier D.-C. drift.

Figure 3B:
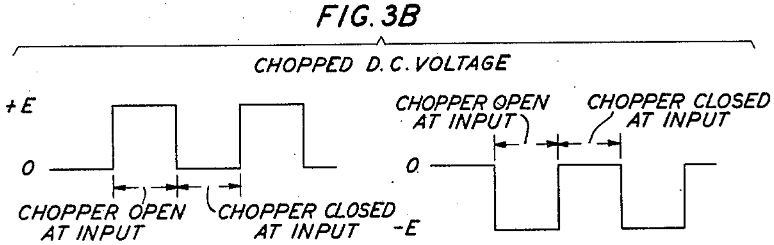
Figure 3C:
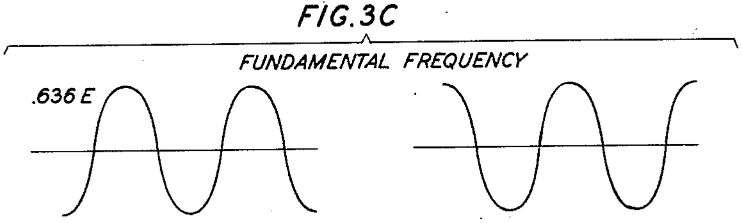

Fig. 3B illustrates the action of chopper 17 in converting the D.-C. drift signal at the input of the A.-C. amplifier to A.-C. Chopper 17 is energized at the frequency to which the A.-C. amplifier is tuned and has the effect of shorting out the D.-C. voltage at the A.-C. amplifier input on alternate half cycles. The resulting waveform at auxiliary summing point 12 includes a fundamental component of the frequency of operation of chopper 17, as shown in Fig. 3C, and a large number of harmonic components.

Figure 3D:
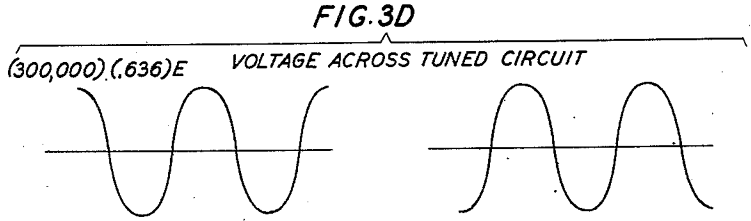
Figure 3E:
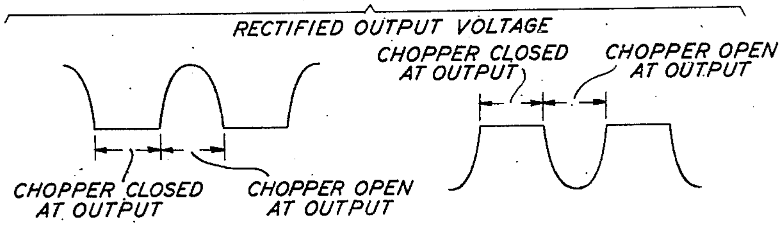

Fig. 3D shows the waveforms appearing at the output of the tuned A.-C. amplifier. Since the A.-C. amplifier is a three-stage device with a phase reversal in each stage, the output is 180 degrees out of phase from the input waveform. For the components given in the above example, the gain of the A.-C. amplifier is approximately 300,000.

Fig. 3B illustrates the action of chopper 17 in rectifying the drift signal. It shorts out alternate half cycles of the tuned amplifier output waveform, restoring a large D.-C. component to the drift signal. Since armature 20 of chopper 17 engages chopper contacts 18 and 19 during respectively alternate half cycles, the effect of the combination of the chopper and the tuned amplifier is to preserve the original D.-C. polarity of the drift voltage. As has already been explained, this rectified voltage is filtered and, in accordance with principles of the invention, applied to the D.-C. summing amplifier as an additional input, thereby greatly reducing the D.-C. drift component of the summing amplifier output voltage.

Figure 4:
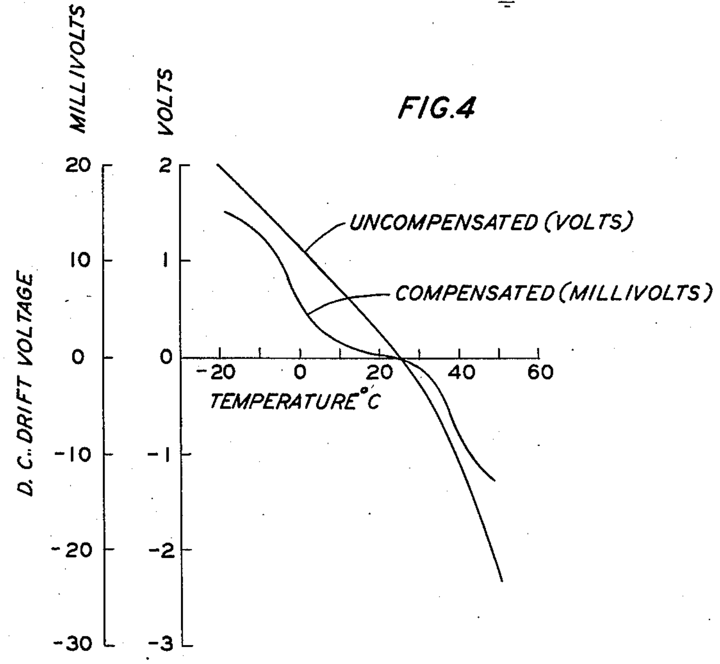
Fig. 4 is a chart illustrating the accuracy of the D.-C. drift compensation made possible by the present invention.

The effectiveness of the present invention in eliminating D.-C. drift in a feedback summing amplifier is illustrated graphically in Fig. 4. There, for the circuit arrangement shown in Fig. 2 and for the component values given above, D.-C. drift in the summing amplifier is plotted against temperature both with and without the drift compensation provided by the invention. As shown, for a temperature variation of from −18° C. to 49° C. (0° F. to 120° F.), D.-C. drift in the uncompensated summing amplifier varies from +2.0 volts to −2.2 volts. Over the same temperature range, however, D.-C. drift in the summing amplifier compensated in accordance with the present invention varies only from +15 millivolts to −12 millivolts. If desired, this drift may be still further reduced by increasing the gain of the A.-C. amplifier.

It is to be understood that the above-described arrangements are illustrative of the application of the principles of the invention. Numerous other arrangements may be devised by those skilled in the art without departing from the spirit and scope of the invention.

What is claimed is:

1. In combination, a low input impedance direct-coupled feedback amplifier which comprises cascade-connected transistor stages of the common emitter configuration, said amplifier having an input terminal and an output terminal and providing a net phase reversal between these terminals, a first resistor connected to said input terminal, means to supply a signal voltage to the side of said first resistor remote from said input terminal, and means to substantially eliminated any direct-current drift component appearing in the output voltage at said output terminal of said direct-coupled amplifier which comprises an auxiliary summing point defined by the common junction of a second resistor, a third resistor, and a fourth resistor, said second resistor being connected between said auxiliary summing point and the side of said first resistor remote from said input terminal, said third resistor being connected between said auxiliary summing point and said output terminal, and said fourth resistor being connected between said auxiliary summing point and ground, said second, third, and fourth resistors being so proportioned that voltages appearing at said auxiliary summing point, being proportional to and in phase with the input and output signal voltages of said direct-coupled feedback amplifier and consequently in phase opposition with one another, cancel each other leaving a direct voltage at said auxiliary summing point substantially proportional to and in phase with said direct-current drift component appearing in the output voltage of said direct-coupled feedback amplifier, a tuned alternating-current amplifier which comprises cascade-connected transistor stages of the common emitter configuration, said alternating-current amplifier having an input terminal and an output terminal and providing a net phase seversal between these terminals, said input terminal of said alternating-current amplifier being connected to said auxiliary summing point, a chopper which comprises a first contact, a second contact, and a contactor, said first contact being connected to said auxiliary summing point, said second contact being connected to said output terminal of said alernating-current amplifier, and said contactor being connected to ground, means for alternately engaging said contactor with said contacts at the frequency to which said alternating-current amplifier is tuned, said chopper converting said direct voltage at said auxiliary summing point to an alternating voltage and reconverting the output voltage of said alternating-current amplifier to a direct voltage substantially proportional to and in phase with said direct voltage at said auxiliary summing point, and means connecting said output terminal of said alternating-current amplifier with said input terminal of said direct-coupled feedback amplifier, said last-mentioned means comprising a low-pass filter network, all of said voltages being with respect to ground potential.

2. The combination in accordance with claim 1 wherein said low input impedance direct-coupled feedback amplifier comprises a plurality of transistors of one conductivity type and at least one transistor of the opposite conductivity type.

3. In combination, a low input impedance direct coupled feedback summing amplifier which comprises cascade-connected transistor stages of the common emitter configuration, said amplifier having an input terminal and an output terminal and providing a net phase reversal between these terminals, a plurality of first resistors each of which is associated with a separate source of signal voltage and connected between its associated source of signal voltage and said input terminal of said direct-coupled amplifier, means to substantially eliminate any direct-current drift component appearing in the output voltage at said output terminal of said direct-coupled amplifier which comprises a plurality of second resistors each of which is associated with one of said first resistors and is connected between a common junction point and a junction point between its associated first resistor and said associated first resistor's associated source of signal voltage, said plurality of second resistors being equal in number to said plurality of first resistors, an auxiliary summing point being defined by said common junction of said plurality of second resistors, a third resistor, and a fourth resistor, said third resistor being connected between said auxiliary summing point and said output terminal of said direct-coupled amplifier, and said fourth resistor being connected between said auxiliary summing point and ground, each of said second resistors being proportioned with respect to said third resistor and said fourth resistor so that voltages, substantially proportional to and in phase with said signal voltages applied at the sides of said first resistors remote from said input terminal of said direct-coupled amplifier, and components of the voltage, substantially proportional to said output voltage appearing at said output terminal of said direct-coupled amplifier, when superimposed upon each other at said auxiliary summing point, cancel each other leaving a direct voltage at said auxiliary summing point substantially proportional to and in phase with said direct-current drift component appearing in the output voltage of said direct-coupled amplifier, means connected to said auxiliary summing point to derive a voltage substantially proportional to and in phase with the voltage at said auxiliary summing point, and means to apply said voltage derived from said auxiliary summing point to said input terminal of said direct-coupled feedback amplifier, all of said voltages being with respect to ground potential.

References Cited in the file of this patent

UNITED STATES PATENTS

| | | |
|---|---|---|
| 2,619,552 | Kerns | Nov. 25, 1952 |
| 2,684,999 | Goldberg et al. | July 27, 1954 |
| 2,714,136 | Greenwood | July 26, 1955 |

FOREIGN PATENTS

| | | |
|---|---|---|
| 620,140 | Great Britain | Mar. 21, 1949 |